US009758907B2

(12) United States Patent
Graumann et al.

(10) Patent No.: US 9,758,907 B2
(45) Date of Patent: Sep. 12, 2017

(54) METHOD AND APPARATUS FOR ATTACHING CHIP TO A TEXTILE

(75) Inventors: David Graumann, Portland, OR (US); David Bruneau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1306 days.

(21) Appl. No.: 12/284,440

(22) Filed: Sep. 22, 2008

(65) Prior Publication Data

US 2010/0071205 A1    Mar. 25, 2010

(51) Int. Cl.
| | | |
|---|---|---|
| *D03J 1/00* | (2006.01) | |
| *D03D 1/00* | (2006.01) | |
| *D03D 15/00* | (2006.01) | |
| *D03D 15/02* | (2006.01) | |
| *H05K 1/03* | (2006.01) | |
| *H05K 1/18* | (2006.01) | |

(52) U.S. Cl.
CPC ............ *D03J 1/00* (2013.01); *D03D 1/0088* (2013.01); *D03D 15/00* (2013.01); *D03D 15/02* (2013.01); *H05K 1/038* (2013.01); *D10B 2101/20* (2013.01); *D10B 2201/02* (2013.01); *D10B 2211/02* (2013.01); *D10B 2401/16* (2013.01); *D10B 2503/04* (2013.01); *D10B 2505/08* (2013.01); *H05K 1/189* (2013.01); *H05K 2201/029* (2013.01); *H05K 2201/0281* (2013.01); *H05K 2201/10977* (2013.01); *Y10T 29/49117* (2015.01); *Y10T 29/5313* (2015.01)

(58) Field of Classification Search
CPC ......... D03J 1/00; D03D 1/0088; D03D 15/00; D03D 5/02; H05K 1/038; Y10T 29/49117; Y10T 29/5313

USPC ........ 29/825, 729, 740, 742, 749, 760, 762, 29/832, 850, 748; 219/549, 529, 542, 219/551, 211; 139/425 R, 29; 174/251
See application file for complete search history.

(56) References Cited

U.S. PATENT DOCUMENTS

| | | | | | |
|---|---|---|---|---|---|
| 3,631,298 | A | * | 12/1971 | Davis | 361/809 |
| 3,973,418 | A | * | 8/1976 | Close | 70/34 |
| 4,502,717 | A | * | 3/1985 | Close | 70/57.1 |
| 5,099,228 | A | * | 3/1992 | Israel et al. | 340/572.1 |
| 5,347,262 | A | * | 9/1994 | Thurmond et al. | 340/572.9 |
| 5,680,681 | A | * | 10/1997 | Fuss | 24/704.1 |
| 6,002,267 | A | * | 12/1999 | Malhotra et al. | 324/750.3 |
| 6,210,771 | B1 | * | 4/2001 | Post et al. | 428/100 |
| 6,255,950 | B1 | * | 7/2001 | Nguyen | 340/572.8 |
| 6,381,482 | B1 | * | 4/2002 | Jayaraman et al. | 600/388 |
| 6,729,025 | B2 | * | 5/2004 | Farrell et al. | 29/854 |

(Continued)

FOREIGN PATENT DOCUMENTS

| | | |
|---|---|---|
| WO | 2010/033902 A2 | 3/2010 |
| WO | 2010/033902 A3 | 6/2010 |

OTHER PUBLICATIONS

International Search Report and Written Opinion received for PCT Patent Application No. PCT/US2009/057660, mailed on Apr. 20, 2010, 10 pages.

(Continued)

*Primary Examiner* — Peter DungBa Vo
*Assistant Examiner* — Kaying Kue
(74) *Attorney, Agent, or Firm* — Jordan IP Law, LLC (57) ABSTRACT

Embodiments disclosed herein provide approaches for attaching scan control and other electronic chips to textiles, e.g., on a loom as part of a real-time manufacturing process.

9 Claims, 7 Drawing Sheets

(56) References Cited

U.S. PATENT DOCUMENTS

| | | | |
|---|---|---|---|
| 7,049,626 B1* | 5/2006 | Chen | 257/9 |
| 7,144,830 B2* | 12/2006 | Hill et al. | 442/205 |
| 7,190,272 B2* | 3/2007 | Yang et al. | 340/572.8 |
| 7,474,222 B2* | 1/2009 | Yang et al. | 340/572.8 |
| 7,536,884 B2* | 5/2009 | Ho | 70/57.1 |
| 7,724,146 B2* | 5/2010 | Nguyen et al. | 340/572.8 |
| 7,821,403 B2* | 10/2010 | Hogan et al. | 340/572.9 |
| 8,376,564 B2* | 2/2013 | Finn | 362/103 |
| 8,459,069 B2* | 6/2013 | Garner | 70/57.1 |
| 2001/0036785 A1* | 11/2001 | Takagi et al. | 442/229 |
| 2002/0074937 A1* | 6/2002 | Guberman et al. | 313/511 |
| 2002/0076948 A1* | 6/2002 | Farrell et al. | 438/800 |
| 2002/0121146 A1* | 9/2002 | Manaresi et al. | 73/862.68 |
| 2002/0167483 A1* | 11/2002 | Metcalf | 345/156 |
| 2003/0119391 A1 | 6/2003 | Swallow et al. | |
| 2004/0159131 A1* | 8/2004 | Huehner | 70/57.1 |
| 2006/0012944 A1* | 1/2006 | Mamigonians | 361/303 |
| 2008/0006453 A1* | 1/2008 | Hotelling | 178/18.06 |

OTHER PUBLICATIONS

International Preliminary Report on Patentability received for PCT Patent Application No. PCT/US2009/057660, mailed on Mar. 31, 2011, 5 pages.

* cited by examiner

METHOD AND APPARATUS FOR ATTACHING CHIP TO A TEXTILE

BACKGROUND

Embodiments disclosed herein relate generally to electronic textiles and in particular, to methods for applying electronic chips to textiles and apparatuses resulting therefrom.

Textiles such as rugs, drapes, or carpets can be made for monitoring activity such as human traffic for applications including security and customer and patient monitoring. The textile surface is scanned for activity such as persons walking atop it, and the activity is then characterized for monitoring desired information such as the identification of persons in a room.

There are existing methods for attaching chips to textiles. For example, existing approaches include soldering and/or epoxying chips to textiles, using manually intensive embroidery-type machines, stenciling circuitry, and small pick and place machinery. Unfortunately, they tend to be manual, cumbersome, and seemingly do not scale well to large surfaces.

Accordingly, improved approaches may be desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments disclosed herein provide novel approaches for attaching scan control and other electronic chips to textiles, e.g., on a loom as part of a real-time manufacturing process.

Electronic textiles may be used for numerous different applications including building security, health monitoring, ubiquitous computing, and communications where textiles containing small embedded scanning chips can be deployed. Furthermore, they may be implemented in textiles used in a wide variety of settings including floor coverings, hung textiles (e.g. light adjusting drapery), held textiles (e.g. haptics), and upholstered items (e.g. an electronic textile couch).

Figure 1:
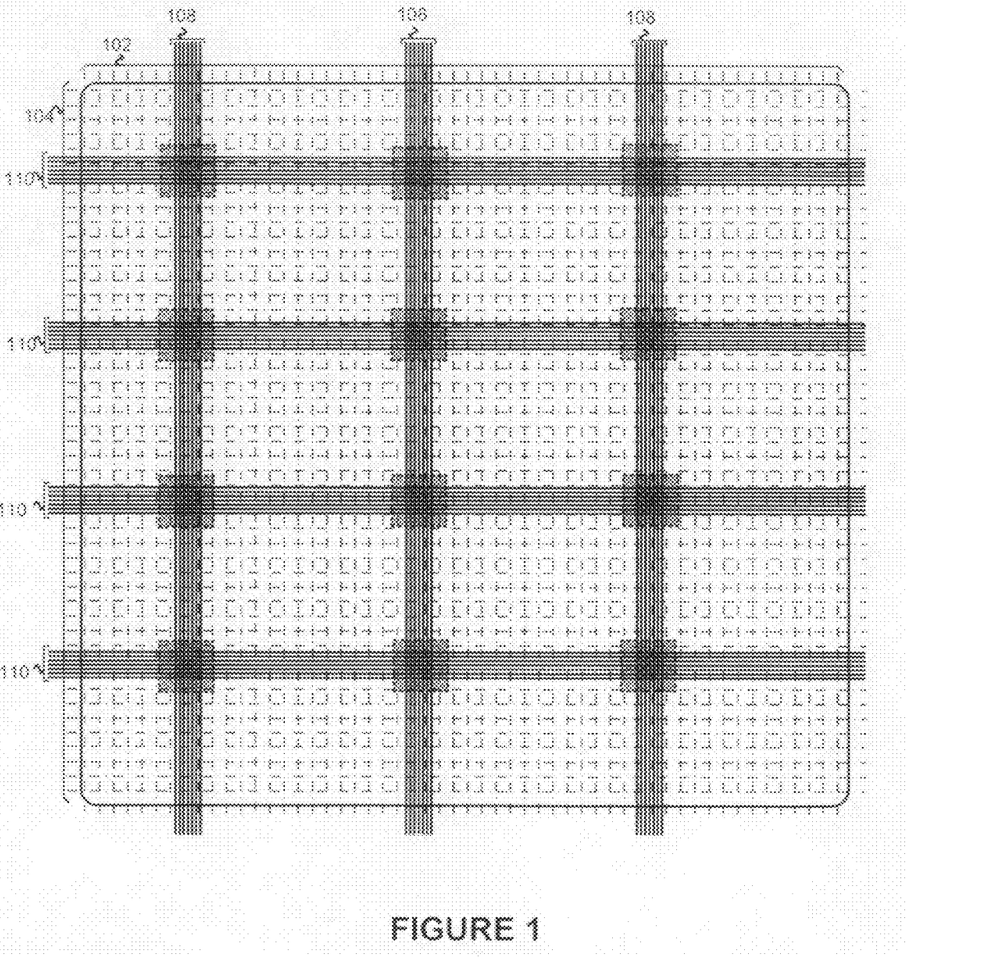
FIG. 1 is a diagram of a textile with sense lines for monitoring activity atop the textile in accordance with some embodiments.

FIG. 1 shows a portion of an electronic textile in accordance with some embodiments. It is made from numerous threads or yarns (not expressly shown) formed from textile material such as synthetic fiber, wool, cotton, or the like, woven together or otherwise fabricated. Embedded (e.g., woven) within the textile material are first and second groups of spaced apart sense lines, 102 and 104, along with chip lines 108 and 110. In this depiction, the first group of sense lines are in a warp direction, while the second group of lines 104 are in a weft direction. As shown, they cross one another forming numerous "cross-points", which can be monitored by chips to be mounted in the shaded areas, as discussed below. The sense lines may be made from any suitable material such as conductive material, e.g., wire or braided steel yarn that can convey electronic signals for monitoring activity and that can be readily woven (or otherwise formed) within the textile, as is known with current methods. The spacing may be of any suitable dimensions depending on particular design considerations. For example, in some embodiments, they may be spaced in a range from one to three inch intervals apart from one another.

The chip lines 108, 110 are also formed (e.g., woven or otherwise embedded) into the textile to couple off-textile signals, power, and sense lines to the scanning chips (not shown) that will be mounted in the shaded areas. In some embodiments, they are implemented with insulated tinsel wire that can be exposed at desired locations during a manufacturing phase to couple them to the chips, as well as to the sense lines. They may be implemented with braided wire, wire ribbons, or any other suitable material. (It should be appreciated that both the sense and/or chip lines may be woven or otherwise formed into the textile, or alternatively, may be attached beneath it or within a separate material such as, for example, a pad to be placed under the textile.)

Figure 2:
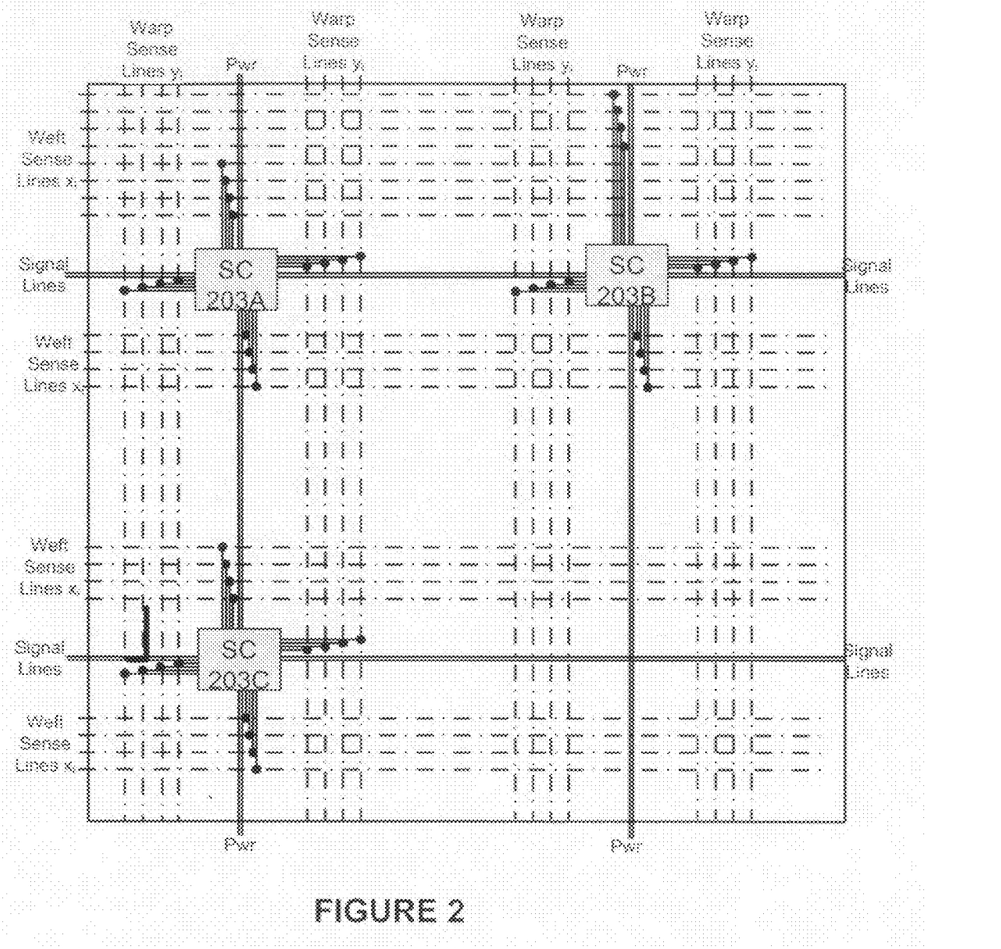
FIG. 2 is a diagram showing embedded scan control chips in a textile such as the textile of FIG. 1 in accordance with some embodiments.

FIG. 2 is a diagram showing a more detailed portion of the electronic textile from FIG. 1. Shown here are chip lines to couple off-textile power (Pwr) lines, off-textile signal lines (Signal Lines), and warp/weft sense lines to scanning chips 203. (For simplicity sake, only a portion of the textile is shown, and only some of the sense lines and chip lines are shown. Moreover, the open spaces between sense line sections would typically be filled in an actual implementation but appear here for ease of understanding to keep the drawing from becoming too cluttered.) It should be appreciated that in some embodiments, there may be more or less chip lines per scanning chip to connect to the different sense lines. In addition, while separate power (Pwr) and signal (Signal Lines) lines are used, in some embodiments, they may co-exist on the same lines (e.g., DC supply and AC signal sharing common line) or alternatively, signals could be conveyed on the textile using wireless techniques.

In the depicted embodiment, separate chips (e.g., 203A, 203B, 203C, etc.) are used to monitor separate regions of the textile. More chips allow for less chip lines per chip and faster scanning but may cost more and be less efficient to manufacture. Accordingly, appropriate trade-offs may be considered for particular implementations in deciding how many chips to use for scanning.

In some embodiments, the scanning chips 203 are implemented with so-called system on chip (SoC) devices, e.g., chips from the Intel™ EP80579 Integrated Processor family. The scanning chips 203 are configured to scan the surface for details of surface occupancy. Users walk on the surface and are sensed by the scanning chip circuitry for cross-point connectivity, which results from, e.g., foot pressure atop the cross-point. Cross-point level changes may be analyzed using computer vision methods for gait analysis and occupancy tracking. Conceptually one could liken the electronic textile surface to a large keyboard or touch screen. With embodiments disclosed herein, scanning processing methods are able to sense multiple cross-point hits (or occurrences) on one or more sense lines at the same time, and even though conductive wire can be used for the sense lines to indicate activity when crossing lines touch one another, the degree (or magnitude) to which they contact each other may also be assessed, in addition to whether they are or are not in contact with each other.

In accordance with some embodiments, the chips may be attached to the textile in three main stages. Initially, one or more sites for receiving a chip may be prepared. This may involve locating the chip lines where the chip is to be attached (e.g., while the textile is moving in the loom) and preparing the site for attachments. Next, the chip may be attached, and also possibly cured, depending on the type of utilized chip package. This may involve securing the chip with a minimum of location accuracy and letting the connection cure and/or seal, e.g., while the textile is moving. Lastly, the chip may be configured, or at least partially configure itself, for operation. This may involve applying power and/or other signals to the chip lines for node-to-node configuration of power and signal lines. It may also involve cutting chip lines, once secured by the chip connectors, so that a line (or lines) that otherwise would pass through a chip, can be used as two separate lines (or line sets), extending away from opposite sides of the chip.

The stage of site identification and preparation will now be discussed. This stage involves locating and aligning a site, e.g., on a woven textile, where a chip (e.g., a scan control chip 203) is to be attached. An apparatus such as that shown in FIG. 3 may be used to assist in this task.

Figure 3:
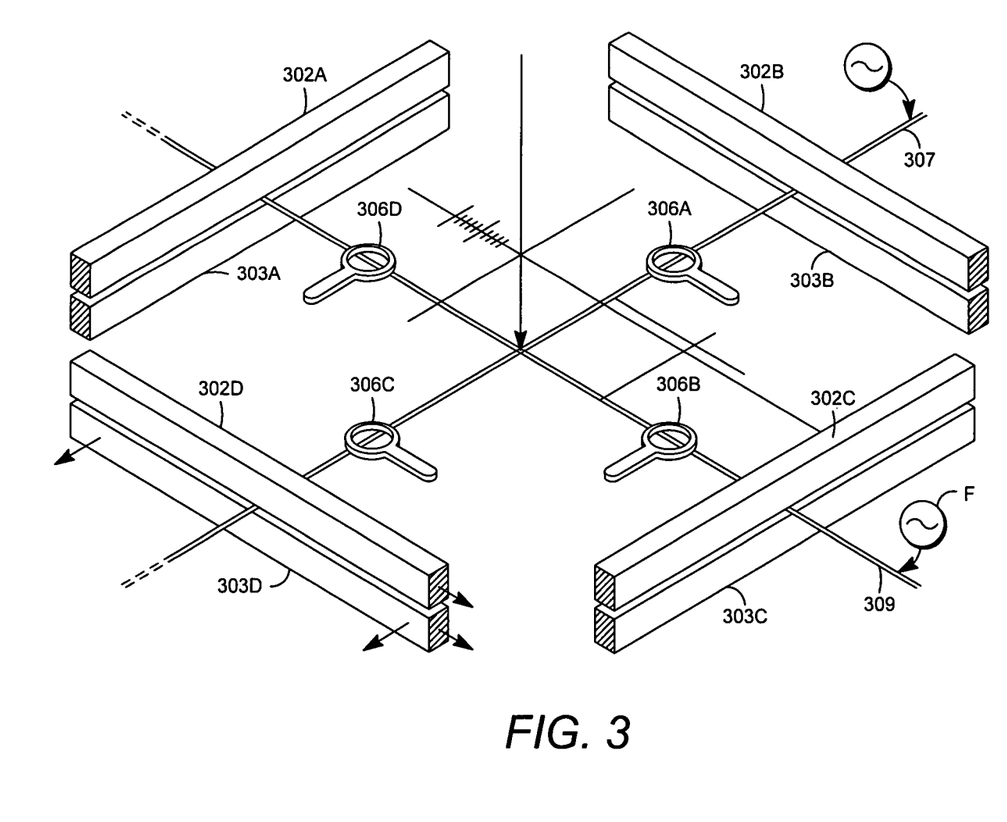
FIG. 3 is a perspective diagram showing a portion of a clamping apparatus to secure a textile surface for attaching a chip in accordance with some embodiments.

FIG. 3 shows a portion of an apparatus that may be used to identify and stabilize a site location for attachment of a chip. The apparatus comprises clamps formed from cooperating upper and lower portions (302A/303A, 302B/303B, 302C/303C, and 302D/303D). It also comprises line location sensors (306A-306D) which in the depicted embodiment are implemented with inductive loop sensors. In some embodiments, the sensors are fixed relative to the clamps, which are laterally adjustable on the plane of the textile so that the clamped textile portion can be suitably oriented for position of chip lines 307 and 309. (Note that chip lines 307 and 309 may represent a bundle of one or more lines, e.g., a ribbon of multiple lines or a braided bundle.)

An upper mechanism (not shown) may house the upper clamp portions 302, which may be separately coupled to the upper mechanism for independent lateral positioning. Similarly, a lower mechanism could house the lower clamp portions 303. These upper and lower mechanisms would provide vertical (up/down relative to the surface of the textile) positioning of their respective clamp portions.) The sensors 306 could be mounted to either or both the upper and lower mechanisms.

The clamps 302/303 secure the attachment site of the textile along the weft and warp axes. Once the textile target site is clamped, an appropriate level of lateral tension, effectively stretching apart the target portion in both axes, is placed on the textile to tighten the chip lines 307 and 309. In some embodiments, an alternating electrical signal is transmitted from the textile edge through either or both of the chip lines (or chip line bundles) 307, 309. This signal is then inductively sensed using the inductive sensing loops 306. Alternatively or in combination with, the location of the chip lines 307, 309 may be established using uniquely color-coded chip lines and sensed using optical sensors from above and/or below the textile. In this fashion, the location along a single wire (e.g., in a bundle) or the intersection of two wires may be determined. The clamps may then be moved, e.g., along weft and warp axes, to suitably align the wires for chip attachment (e.g., orthogonally align the wires at their crossover location).

At this point, insulation on the chip lines, at appropriate locations, may be removed from the line(s) in preparation for attaching the chip module(s). Any suitable method may be used to strip the insulation. For example, a laser may be used to make a suitable cut in it for it to pull away enough desired metal space for connection to connector pads in the chip. Alternatively, a "V" type knife or some other mechanical stripping mechanism may be used. It may be desirable to use a laser or other focused heat source to melt away insulation from a desired area so that it vaporizes or is suitably "wicked" away so as not to inhibit adequate conductive adherence to the chip pads. (It should be appreciated that the mechanism such as that shown in FIG. 3 for preparing a textile site, along with the mechanisms for attaching the chips, may be fixed and require a static textile or may be made to move, e.g., synchronously, with the textile along the loom in coordination with a textile manufacturing process.)

Figure 4:
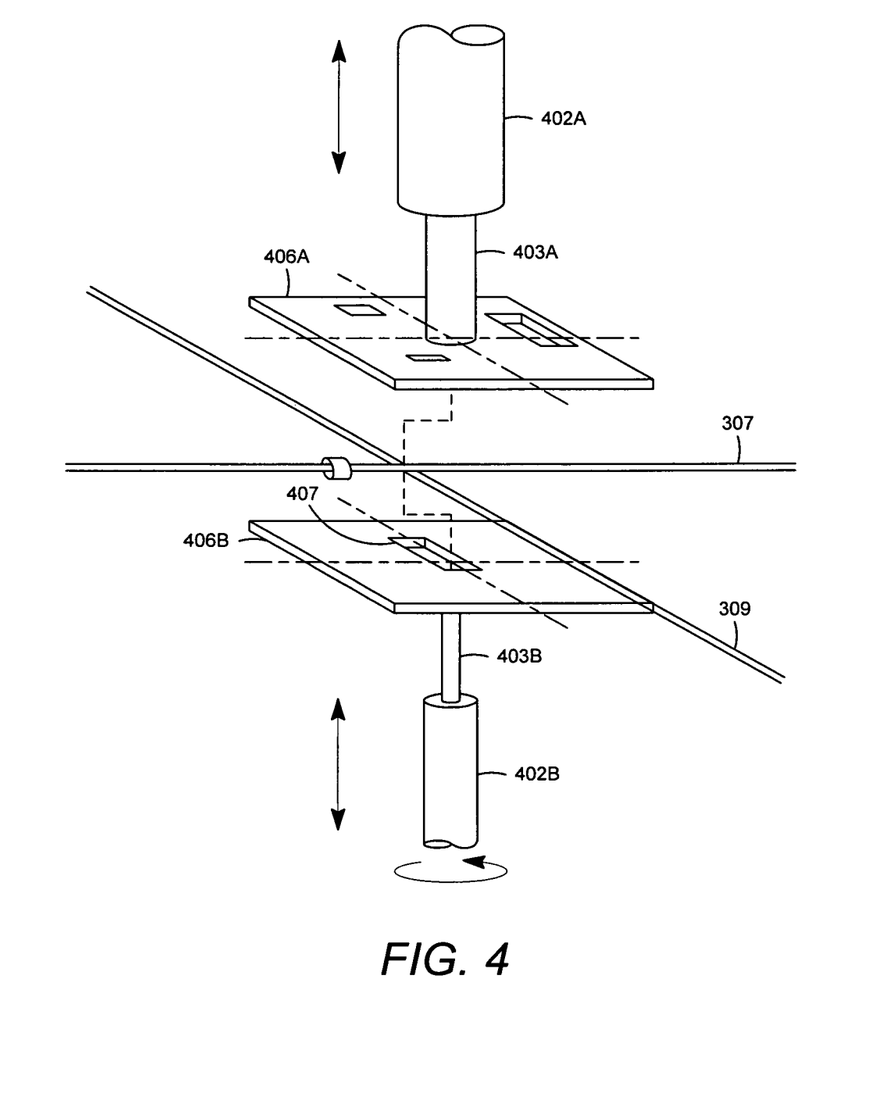
FIG. 4 is a perspective diagram showing a portion of an apparatus for attaching a chip to a textile in accordance with some embodiments.

With reference to FIG. 4, in some embodiments, the chip to be attached may be build using two layers, an upper portion 406A and a lower portion 406B, which in this embodiment, includes the chip 407, although either one or both of these package portions could be populated with electronic components. In one embodiment they exist as two halves of a single integrated package. Before attaching to one another, the two layers are held by upper and lower rotatable mounting mechanisms 403A, 403B, respectively, which are each housed in cylinders 402A, 402B, respectively, for moving them toward one another. In some embodiments, the mounting mechanisms may be on either side of the textile, as is the case here. In other embodiments, both mounting mechanisms may be on the same side, e.g., with one mechanism able to "punch" through a loose weave to access the opposite surface. These mounting mechanisms position the upper and lower chip package layers 406A, 406B onto the prepared textile site and in attachable disposition with one another. They may be rotatable to allow the package layers (or halves) to be rotatably "locked" together, e.g., prior to being more permanently and reliably joined such as with an appropriate epoxy material.

Alignment to the crossing chip lines may be based on a relative coordinate system established during the site preparation stage. If additional, e.g., non-electrical material, is desired to pass between the chip package surfaces, then it may be manipulated into place at this time before the upper and lower layers are joined.

In some embodiments, low temperature methods can be used for establishing electrical connections between the upper and lower layers and between the processing chip and the conducting (stripped away) portions of the chip lines. Examples include insulation displacement, pressure contact, or conductive epoxy. Once the textile site has been prepared in this way, the upper and lower chip package layers are then compressed against the textile to each other. They may be fixedly joined using two joining stages, the first joining stage being a mechanical coupling, e.g., locking or snapping together, for securing the layers until they can be suitably secured using the second joining stage for reliable operation. The second stage could involve a more durable joining method such as conducting and/or non-conducting epoxying, which typically takes time to cure. This may also be used to enhance electrical conductivity between chip package connections (e.g., pads) and the chip lines. The initial connecting method could employ matching mechanical clamps on the upper and lower layers to snap and hold the layers together while the epoxy cures. This provides initial 'pre-cured' stabilization of the textile site, thereby allowing for immediate de-tensioning of the first stage clamps 302/303 on the chip lines within the textile, e.g., as it moves through the loom. Once the upper and lower modules are secured, the longer term joining solution can cure within the more freely moving textile reel.

Figure 5:
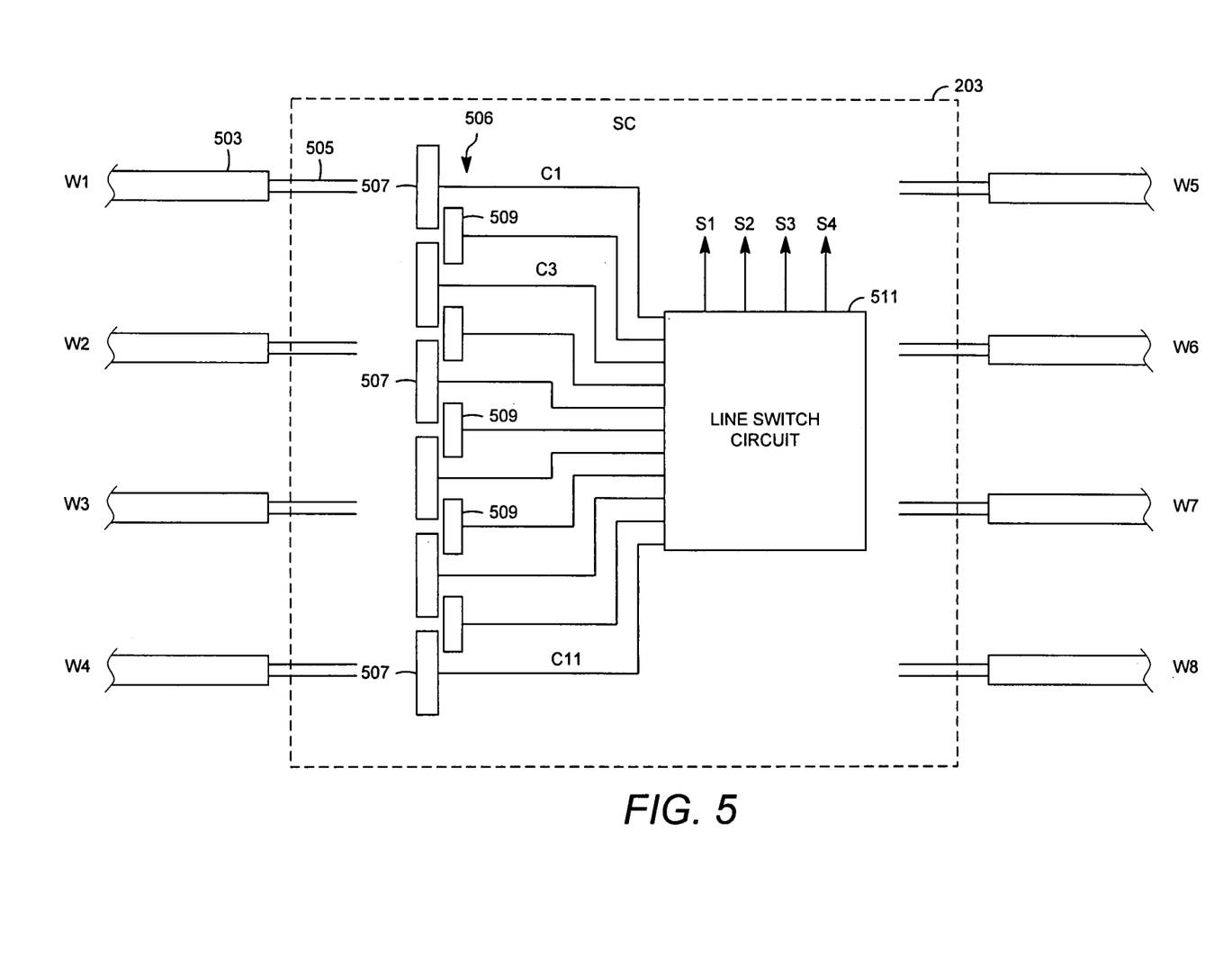
FIG. 5 is a diagram showing connector pads in a chip to be attached to a textile in accordance with some embodiments.

With reference to FIG. 5, a connector portion 506 for one side of a chip is schematically shown. It is configured to suitably connect to chip lines even when it is not practicable to precisely isolate each electrical connection within, e.g., finely placed chip lines, especially when in an unstable environment (e.g., moving, vibrating textile). The challenge increases as the size of the chip lines decrease and/or the density of the weave increases. In this embodiment, the connector 506 has a set of leading edge pads 507 and trailing edge pads 509 that overlap gaps between adjacent leading edge pads. (In alternative embodiments, the leading edge pads could overlap gaps between adjacent trailing edge pads.) With this example, there are eleven pads (six leading edge pads and five trailing edge pads) to connect to four chip wires (W1-W4). The leading edge and trailing edge pads are coupled to eleven corresponding connection lines (C1-C11) that couple to a line switch circuit 511. The line switch circuit 511 has switches, e.g., a network of transistors, to selectively channel (or route), depending which pads are actually connected to the wires, the four incoming wires (W1-W4) into four corresponding signals (S1-S4) within and/or out from the chip 203.

The leading edge electrical pads 507 are aligned in a first column, and the smaller trailing edge pads 509 are aligned in a second column, "behind" the leading edge column. The trailing edge column of pads overlap the gaps in electrical connectivity of the leading edge pads. With this arrangement, precise alignment of the connector over the stripped chip lines to be connected is not required, so long as two or more lines are not connected to a given pad. That is, the wires need not be precisely aligned with one and only one corresponding pad. For example, if the wires are vibrating or if the connector is not precisely aligned and a wire ends up between leading edge pads, a trailing edge pad will be able to suitably receive it. For example, a wire may actually connect to both a leading edge pad and an adjacent trailing edge pad, but this is acceptable because either or both pads can be selected in the switch circuit 511 to be provided as a line (S1-S4) on the chip.

In the depicted embodiment, the connector 506 is part of one of the chip package layers 406A or 406B. The other package layer has a corresponding member or set of pads (not shown) for mating with the pads 507, 509 for securing the wires onto the conductive pads 507, 509. Typically, this member or set of holding pads will be made of an insulating material that can conform about the wires for physically securing them in place. These elements are compressed and held together by appropriate methods such as those described above for mating the package layers together. The attaching material should hold the chip lines with enough strength so that after they have been severed, textile tension and integrity is maintained. (Note that in this figure, eight separate chip lines (W1 to W8) are shown. They result from four chip lines being stripped and severed, e.g., cut within the chip package boundary. The drawing is not to scale and omits other components in the chip, but one may imagine another connector across from connector 506 for connection with wires W5 to W8. With both of these connectors connected and with both chip package layers securely mounted together, the chip module will then secure the chip line sets, W1-W4 and W5-W8, even though they have been severed. Thus, the lines should be cut after the module layers and connectors have been sufficiently mounted to the lines.)

The chip package layers, attaching material, and/or connector members may provide access holes or windows at locations for cutting chip lines and/or for providing access where desired on the textile. For example, access holes could be provided on a chip package layer to provide chip line access for a cutting mechanism or a sufficiently translucent window could be provided for a laser to access lines to be cut. Once the lines have been severed, the rigid material will now support the tension on the chip wires. To avoid oxidation and to more evenly distribute chip line joint stress, the entire module may be encapsulated in a material suitable for the curing times of the previous stage and suitable for the textile's use. For example, this could be a rubberized flexible encasing.

(In the depicted embodiment, extra pads are used to provide for misalignment tolerance so that each chip wire is properly connected to a pad. It should be appreciated, however, that other approaches could be used. For example, additional redundant chip lines with less pads could be used. Depending on particular design concerns, redundancy in the chip lines, pads or both may be desired.)

Figure 6:
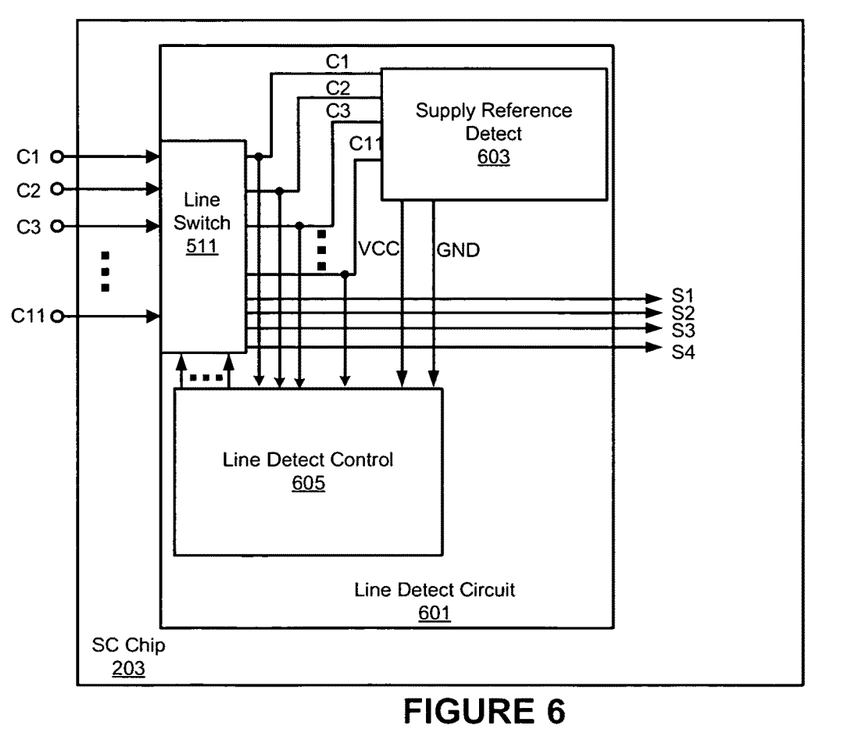
FIG. 6 is a block diagram showing a line detect circuit for an electronic textile chip in accordance with some embodiments.

FIG. 6 shows an exemplary line detect circuit 601 for identifying power signals and appropriately controlling a switch circuit 511 for selecting pads to be routed to signal nodes in the chip. That is, it assesses which connector pads (C1 to C11) should be routed via the switch circuit 511 to appropriately provide power, ground, and other signals to the chip circuitry. The line detect circuit may also be capable of determining if multiple pad connections have been made to a single chip line. The use of the lines (e.g., S1 to S4 in this example) can then be established once the system is powered and booted.

Figure 7:
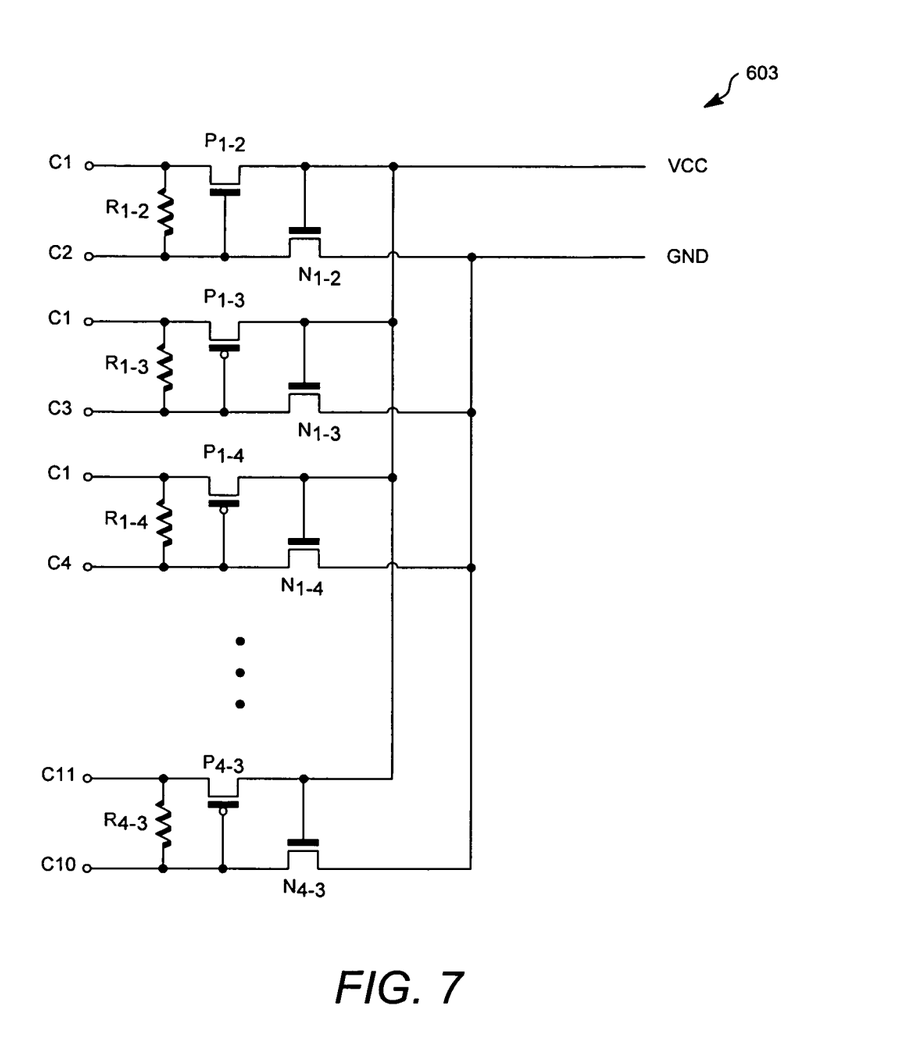
FIG. 7 is a schematic diagram showing a supply reference detect circuit in accordance with some embodiments.

In the depicted embodiment, the line detect circuit 601 comprises the switch circuit 511, a supply reference detect circuit 603, and a line detect control circuit 605. The supply reference detect circuit 603 (an example of which is shown in FIG. 7) couples supply lines, e.g., Vcc and Ground, from the incoming lines to supply reference nodes (VCC and GND) within the chip, without necessarily having to determine which of the incoming lines are providing these supply reference lines. The supply lines are coupled to the line detect control block 605, which has circuitry for identifying which of the pads (C1 to C11) are coupled to the incoming chip lines (W1 to W4). For example, it may include decode circuitry and memory to identify one or more pads that are connected to each of the incoming signal wires, e.g., in response to a test signal from the edge of the textile being applied to the chip lines or sense lines coupled to a chip line. [or this could come from another chip with in the textile which has already received power and is passing it on] The line detect control circuit 605 then controls the switch circuit 511 to appropriately select the correct pads for coupling to signal lines S1-S4.

FIG. 7 shows an exemplary supply reference detect circuit 603 in accordance with some embodiments. This circuit comprises N-type transistors, P-type transistors, and resistors, coupled together as shown to receive each combination of pairs of connector pads (C1 to C11) as shown. If power and ground are present on any of these pairs, then power and ground will be established on the indicated VCC and GND output nodes. With this circuit, only one pair of the connector pad nodes will be passed to these output supply nodes. After the leads supplying VCC and GND have been determined, the remaining pads, in some embodiments, may then be isolated from the supply reference detect circuit 511.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus, comprising:
a first chip package portion of a chip package to be mounted to a textile, said first chip package portion having a connector with a first set of pads having gaps between the pads and a second set of pads to overlap the gaps of the first set of pads, in which the first chip package portion is to be mounted to a second chip package portion from an opposite side of the textile.

2. The apparatus of claim 1, in which the first and second sets of pads include more pads than are to be coupled to wires in the textile.

3. The apparatus of claim 1, in which the first chip package portion comprises a switch circuit to route selected ones of the first and second groups of pads to signal nodes.

4. The apparatus of claim 3, in which the first chip package portion comprises a supply reference detect circuit to provide supply references from the first and second groups of pads.

5. The apparatus of claim 1, in which the first set of pads are leading edge pads.

6. The apparatus of claim 1, in which the first chip package portion comprises access ports for cutting wires to be mounted to the pads.

7. The apparatus of claim 1, in which the first chip package and the second chip package portion are to be initially mechanically joined followed by a more secure joining.

8. An apparatus, comprising:
an electronic module package to mount to a textile, the electronic module package having first and second chip package portions, the first chip package portion having redundant pads for connection to wires in the textile, in which the first chip package portion and the second chip package portion mount to one another from opposite sides of the textile.

9. The apparatus of claim 8, in which the redundant pads comprise a first group of aligned pads and a second group of aligned pads, wherein at least some of the pads in the second group overlap gaps between at least some of the pads in the first group.

* * * * *